(12) United States Patent
Triepels et al.

(10) Patent No.: US 7,064,751 B1
(45) Date of Patent: Jun. 20, 2006

(54) DISPLAY DEVICE

(75) Inventors: Jozeph W. Triepels, Heerlen (NL); Roel H. L. Kusters, Heerlen (NL); Fransiscus G. C. Verweg, Heerlen (NL); Henri S. A. Handels, Heerlen (NL); Marcel S. B. Bachus, Heerlen (NL); Johannes W. J. M. Scheuermann, Heerlen (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 09/519,551

(22) Filed: Mar. 6, 2000

(30) Foreign Application Priority Data

Mar. 8, 1999 (EP) .................................. 99200671

(51) Int. Cl.
  *G09G 3/36* (2006.01)
(52) U.S. Cl. ..................... 345/205; 345/206; 439/65
(58) Field of Classification Search .................. 345/76, 345/80, 103, 204, 205, 206; 439/65, 66, 439/67
  See application file for complete search history.

(56) References Cited

U.S. PATENT DOCUMENTS

| 4,629,942 | A | * | 12/1986 | Horio et al. | 315/169.4 |
|---|---|---|---|---|---|
| 5,305,130 | A | | 4/1994 | Yamawaki | 359/88 |
| 5,335,100 | A | * | 8/1994 | Obata | 349/65 |
| 5,436,744 | A | * | 7/1995 | Arledge et al. | 359/82 |
| 5,706,069 | A | * | 1/1998 | Hermens et al. | 349/153 |
| 5,802,699 | A | * | 9/1998 | Fjelstad et al. | 29/593 |
| 5,812,227 | A | * | 9/1998 | Toshida et al. | 349/88 |
| 5,834,327 | A | * | 11/1998 | Yamazaki et al. | 438/30 |
| 5,838,400 | A | * | 11/1998 | Ueda et al. | 349/58 |
| 5,851,709 | A | * | 12/1998 | Grande et al. | 430/7 |
| 5,868,582 | A | * | 2/1999 | Jacobi | 439/74 |
| 5,972,527 | A | * | 10/1999 | Kaijou et al. | 428/697 |
| 5,973,761 | A | * | 10/1999 | Gofuku et al. | 349/128 |
| 6,027,366 | A | * | 2/2000 | Mori et al. | 439/495 |
| 6,236,440 | B1 | * | 5/2001 | Johnson et al. | 349/122 |
| 6,563,554 | B1 | * | 5/2003 | Okamoto et al. | 349/12 |

FOREIGN PATENT DOCUMENTS

| DE | 4309186 | 2/1994 |
|---|---|---|
| EP | 0614219 A1 | 9/1994 |

\* cited by examiner

*Primary Examiner*—Richard Hjerpe
*Assistant Examiner*—Abbas Abdulselam

(57) ABSTRACT

A flexible foil having double-sided conductor patterns of a satisfactorily conducting material (gold, silver, nickel) is used in the interconnection of conductor patterns of a display device (LCD, OLED), which enhances the freedom of design.

10 Claims, 2 Drawing Sheets

DISPLAY DEVICE

BACKGROUND OF THE INVENTION

The invention relates to a display device comprising a first substrate which is provided with a conductor pattern for connecting pixels in an electrically conducting manner. A conductor pattern may be understood to mean both a pattern of exclusively column and row conductors and a more extensive pattern in which drive ICs are incorporated.

Such display devices, notably liquid crystal display devices, are very generally used in, for example, measuring equipment but also in, for example, portable telephones. Moreover, electroluminescent display devices based on (organic) LEDs find an increasingly wider application.

With the on-going miniaturization of electronics, it is possible, on the one hand, to realize more standard drive electronics on the substrate. On the other hand, the need for offering customer-oriented solutions, realizing, for example extra functions, increases simultaneously. Parts of the conductor pattern on the first substrate then become so long that, due to their length, they have a too high resistance. The voltage loss caused thereby leads to too low drive voltages at the area of the pixels, which is at the expense of the correct adjustment of the grey scale or may even lead to non-excitation of the pixel.

SUMMARY OF THE INVENTION

It is, inter alia, an object of the invention to provide a display device, in which, in a reliable manner, the surface of the first substrate is provided with low-ohmic conductors which are connected to the exterior while simultaneously obtaining a maximum freedom of design.

To this end, at least a part of the substrate of a laminar substrate is provided with electrically conducting patterns on both sides of the laminar substrate, which patterns are mutually through-connected in an electrically conducting manner via at least one opening in the laminar substrate.

The conductor patterns are preferably realized as metal patterns, with each of the metals being chosen from the group of gold, silver and nickel. The conductor pattern may assume any desired shape. Due to the choice of the low-ohmic metals as a material for the conductor patterns, the length of a conductor track does not have any influence or hardly has any influence on the resistance. This means that the conductor patterns can be laid around the display section, if desired, and can be connected at any arbitrary place with a conductor for a further (external) contact, for example, a connector.

A first embodiment of a display device according to the invention is characterized in that the conductor pattern on the first substrate is connected to an electrically conducting pattern on the foil at the area of a through-connection. By providing the through-connections just along an edge of the actual display section (i.e. close to the pixels), the resistance of the conductor pattern (usually ITO tracks) hardly influences the total resistance.

A further embodiment of a display device according to the invention is characterized in that the foil is flexible. Direct external contacts can be realized via such a flexible foil, but alternatively, such a foil can be bent around an edge of the substrate, with the conductor pattern being connected in a customary manner (for example, via anisotropic conductance) to a metallization pattern of, for example, a printed circuit board.

Another embodiment of a display device according to the invention is characterized in that electrically conducting patterns on both sides of the foil form a cross-connection. The use of such cross-connections further increases the number of possibilities of designing the circuit to be realized on the foil.

The invention is applicable to display devices which are based on liquid crystal effects or other electro-optical effects, in which an electro-optical material is present between two substrates. Such an embodiment is characterized in that the display device comprises a second substrate and an electro-optical material between the two substrates, each provided with picture electrodes defining pixels together with the interpositioned electro-optical material.

The display device may also be based on an electroluminescent effect.

These and other aspects of the invention are apparent from and will be elucidated with reference to the embodiments described hereinafter.

BRIEF DESCRIPTION OF THE DRAWINGS

FIG. 5 is a diagrammatic plan view of a part of a second embodiment of a display device according to the invention, while

The Figures are diagrammatic and not to scale; corresponding components are generally denoted by the same reference numerals.

DETAILED DESCRIPTION OF THE PREFERRED EMBODIMENTS

Figure 1:
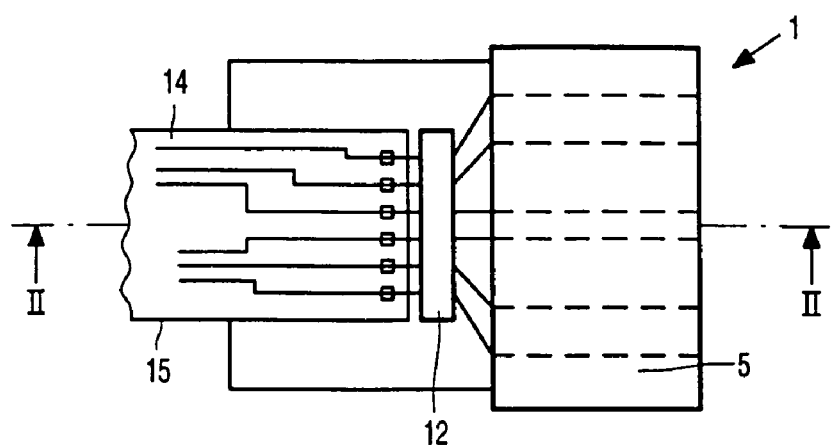
FIG. 1 is a diagrammatic plan view of a part of a first embodiment of a display device according to the invention.
Figure 2:
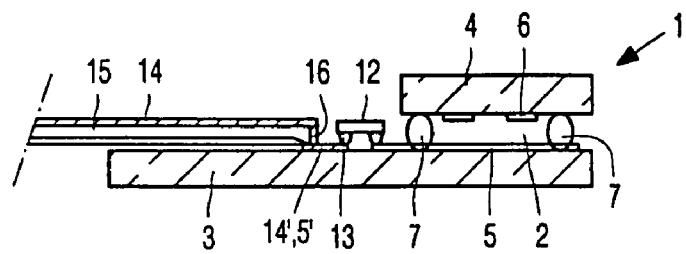
FIG. 2 is a diagrammatic cross-section taken on the line II—II in FIG. 1.

FIG. 1 is a diagrammatic plan view and FIG. 2 is a cross-section of a part of a display device, in this example a liquid crystal display device comprising a liquid crystal cell 1 with a twisted nematic liquid crystal material 2 which is present between first and second transparent substrates 3, 4 of, for example, glass or synthetic material, provided with electrodes 5, 6 in this embodiment. The device further comprises polarizers (not shown) whose direction of polarization is, for example, mutually crossed perpendicularly. The device also comprises orientation layers (not shown) which orient the liquid crystal material on the inner walls of the substrates, in this embodiment in such a way that the cell has a twist angle of 90 degrees. In this embodiment, the liquid crystal material has a positive optical anisotropy and a positive dielectric anisotropy. When the electrodes 5, 6 are energized with an electric voltage, the molecules, and hence the directors, direct themselves to the fields. The cell 1 is bounded by a cell wall or sealing edge 7.

The transparent electrodes 5, 6 of, for example, ITO (indium tin oxide) which mutually cross each other in this embodiment and define pixels at the area of the crossings must be provided with drive voltages. These may be applied externally, for example, via conducting tracks on a support, for example a printed circuit board.

In the embodiment shown in FIG. 1, the electrodes 5 are provided with drive voltages by means of a drive circuit (IC) 12 mounted on the first substrate 3. The electrodes 5 (and, by means of methods customary in LCD technology, also the electrodes 6) are connected via bumps 13. Other bumps 13 contact conductor patterns 14' on a laminar substrate 15. According to the invention, the laminar substrate (of, for example, polymide) is provided with a conductor pattern on both sides. In this embodiment, the laminar substrate is flexible and has a metal pattern on one side, for example, a gold pattern 14 which defines connecting conductors. The gold pattern 14' on the other side consists of contact areas only in this embodiment, which are connected in an electrically conducting manner to the pattern 14 via through-connections (or vias) 16. If necessary, the contact areas 14' are connected via conductors 5' to the bumps 13. The conductors 5' are not necessarily made of ITO but may be alternatively made of a metal or form part of a pattern of polysilicon tracks when (LT) poly-transistors instead of the drive IC are used for the connection.

Figure 3:
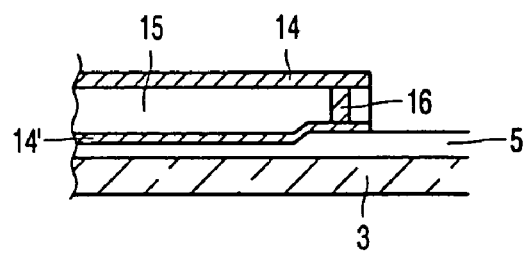
FIG. 3 shows diagrammatically a valiant of a part of FIG. 2.

In the embodiment of FIG. 3, use is made of an extra anisotropic conductor 16, in this embodiment a polyimide copper foil with for example conducting copper tracks transverse to the foil, for the electrical contact between the conductor 14' and the conductor 5 (now there is no IC 12).

Figure 4:
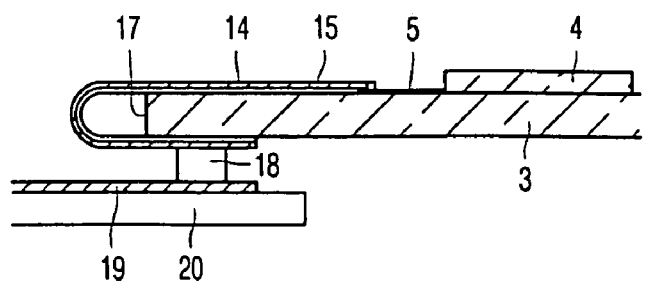
FIG. 4 shows another variant of a part of FIG. 2.

FIG. 4 shows a variant in which the laminar substrate 15 with conductors 14 (as described above) extends as far as the edge 17 of the substrate 3. FIG. 4 clearly shows that a foil as described with reference to FIG. 2 can be bent around the substrate 3 so as to contact conductor tracks 19 on the surface of, for example, a printed circuit board 20, for example, via anisotropic conductors 18.

Figure 5:
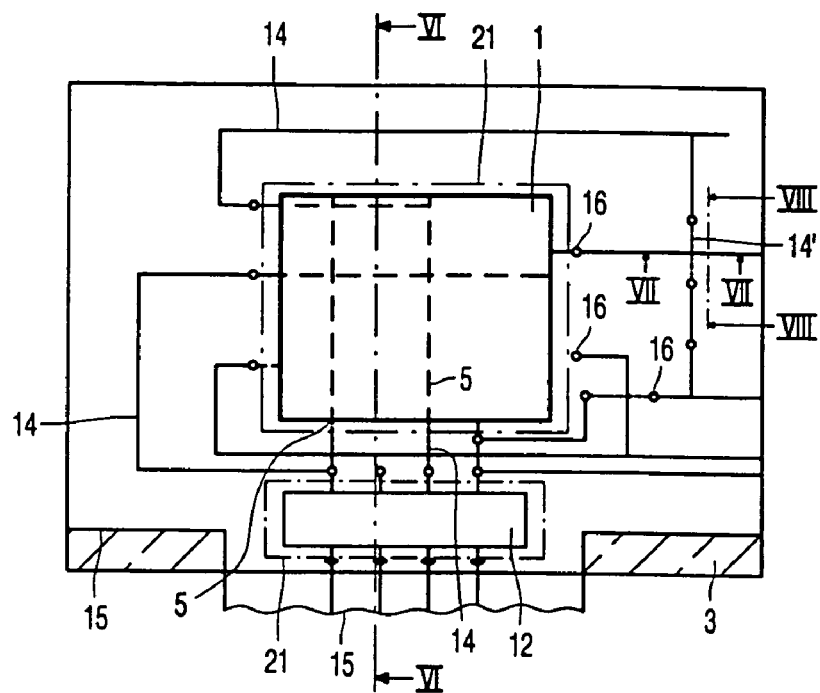
Figure 6:
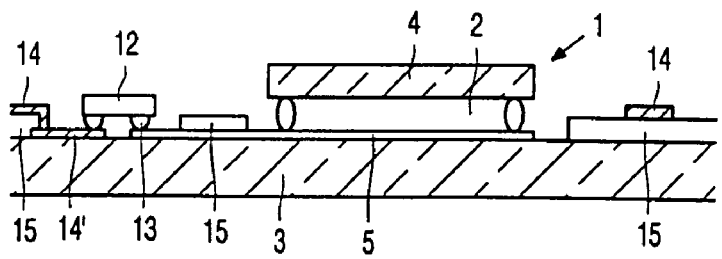
FIG. 6 is a diagrammatic cross-section taken on the line VI—VI in FIG. 5, and FIGS. 7 and 8 are cross-sections taken on the lines VII—VII and VIII—VIII in FIG. 5.
Figure 7:
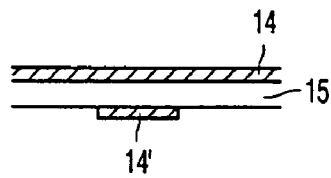
Figure 8:
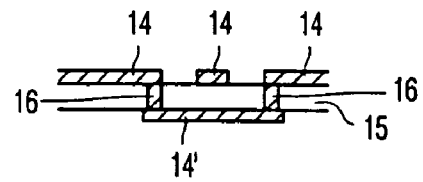

FIG. 5 and FIG. 6 show a variant in which a laminar substrate 15 on the substrate 3 has openings (denoted by means of dot-and-dash lines 21) for a display device 1 (for example, a poly LED display device or, as in this embodiment, an LCD display device) and an IC 12. The conductors 5, 14, 14' are shown arbitrarily for the sake of the example but are considered to form a functional whole. As is apparent from FIG. 5, it is possible to provide a pattern of conductors 14 on the surface of the laminar substrate 15, which pattern contacts the pattern 14' at the area of vias (through-connections) 16. In this manner it is possible, on the one hand, to contact the conductor tracks 5, analogously to FIG. 3. On the other hand, it is possible to locally interrupt a conductor track 14 at the area of vias on one side of the laminar substrate 15 and to realize the connection via through-connections 16 to a conductor track 14' on the other side of the laminar substrate 15. (FIGS. 7,8). In this embodiment, the greater part of the laminar substrate 15 (notably at the area of the conductor patterns 14, 14' and the first through-connections) is secured to the substrate 3, for example, by means of an adhesive connection. If desired, all connections to external contacts may be realized on one side of the substrate, but connections from different sides are alternatively possible. Since the conductor pattern 14 is made of a low-ohmic material (gold, silver, nickel), there is a great freedom of design, while voltage losses due to long conductor tracks do not occur or hardly occur.

The invention is of course not limited to the embodiments shown, but many variations are possible within the scope of the invention. For example, instead of liquid crystal material, other electro-optical materials such as electrophoretic or electrochromic materials may be used.

In summary, the invention relates to the use in a display device (LCD, OLED) of a (flexible) foil which is provided on both sides with low-ohmic, interconnected conductor patterns, thus providing a great freedom of design.

The invention resides in each and every novel characteristic feature and each and every combination of characteristic features.

The invention claimed is:

1. A display device comprising a first substrate having a conductor pattern for electrically connecting pixels, and having a laminar substrate with opposed sides, which opposed sides are both provided with electrically conducting patterns that are electrically through-connected via at least one opening in the laminar substrate, wherein said at least one opening is proximate said pixels.

2. The display device of claim 1, wherein said electrically conducting patterns are metal patterns.

3. The display device of claim 2, wherein said metal patterns are formed from metals chosen from a group of gold, silver and nickel.

4. The display device of claim 1, wherein said conductor pattern on said first substrate is connected to an electrically conducting pattern on said laminar substrate at an area of a through-connection.

5. The display device of claim 4, wherein the part of said laminar substrate provided with said through-connections is secured to said first substrate.

6. The display device of claim 4, wherein at least one of said electrically conducting patterns contacts a conductor pattern on a further support.

7. The display device of claim 1, wherein said laminar substrate is flexible.

8. The display device of claim 1, wherein electrically conducting patterns realized on both sides of said laminar substrate form a cross-section.

9. The display device of claim 1, wherein said display device has a second substrate and an electro-optical material between said first and second substrates, each provided with picture electrodes defining pixels together with said electro-optical material.

10. The display device of claim 1, wherein said display device comprises an electroluminescent material.

* * * * *